United States Patent
Ishibashi

[11] Patent Number: 5,905,699
[45] Date of Patent: May 18, 1999

[54] FOCUSING APPARATUS AND OPTICAL DISK APPARATUS USING THE SAME

[75] Inventor: Yoriyuki Ishibashi, Kawasaki, Japan

[73] Assignee: Kabushiki Kaisha Toshiba, Kawasaki, Japan

[21] Appl. No.: 08/811,721

[22] Filed: Mar. 6, 1997

[30] Foreign Application Priority Data

Mar. 6, 1996 [JP] Japan .................................. 8-049202

[51] Int. Cl.$^6$ .................................................. G11B 7/095
[52] U.S. Cl. .......................... 369/44.26; 369/116; 369/121
[58] Field of Search ............................. 369/44.23, 44.26, 369/109–112, 116, 120–122; 250/201.5

[56] References Cited

U.S. PATENT DOCUMENTS

| | | | |
|---|---|---|---|
| 4,744,073 | 5/1988 | Sugiki | 369/121 X |
| 5,614,708 | 3/1997 | Koishi et al. | 369/116 X |
| 5,659,534 | 8/1997 | Terasaki et al. | 369/121 X |
| 5,703,856 | 12/1997 | Hayashi et al. | 369/112 X |

FOREIGN PATENT DOCUMENTS

| | | |
|---|---|---|
| 60-103531 | 6/1985 | Japan . |
| 5-242551 | 9/1993 | Japan . |
| 6-326002 | 11/1994 | Japan . |
| 8-55363 | 2/1996 | Japan . |
| 8-191171 | 7/1996 | Japan . |

*Primary Examiner*—W. R. Young
*Attorney, Agent, or Firm*—Pillsbury Madison & Sutro, LLP

[57] ABSTRACT

An optical disc apparatus is provided by putting together two substrates with a combined thickness "h", as a recording medium. The two substrates each have a signal mark or a reflective layer which is capable of being the signal mark at least on the backside of the substrates. A laser beam is radiated onto the optical disc through an objective lens, and a reflected light from the reflective layer is detected by means of an optical detection device. One output of the optical detection device is supplied to a signal reader; the other of output thereof is supplied to a focusing apparatus for detecting a focus error of the objective lens and for controlling the positions of the objective lens with respect to the optical disc. Further, in the optical disc apparatus, if a principal wavelength of laser beam source is set as $\lambda_0$; a half-width of laser beam source is set as $\Delta\lambda$; a numerical aperture of the objective lens is set as NA; and a refractive index of substrate material is set as $n_2$, the half-width $\Delta\lambda$ of the laser beam source satisfies the following equation:

$$\Delta\lambda \geq \lambda_0^2 / \{2h(n_2^2 - NA^2)^{0.5}\}.$$

27 Claims, 9 Drawing Sheets

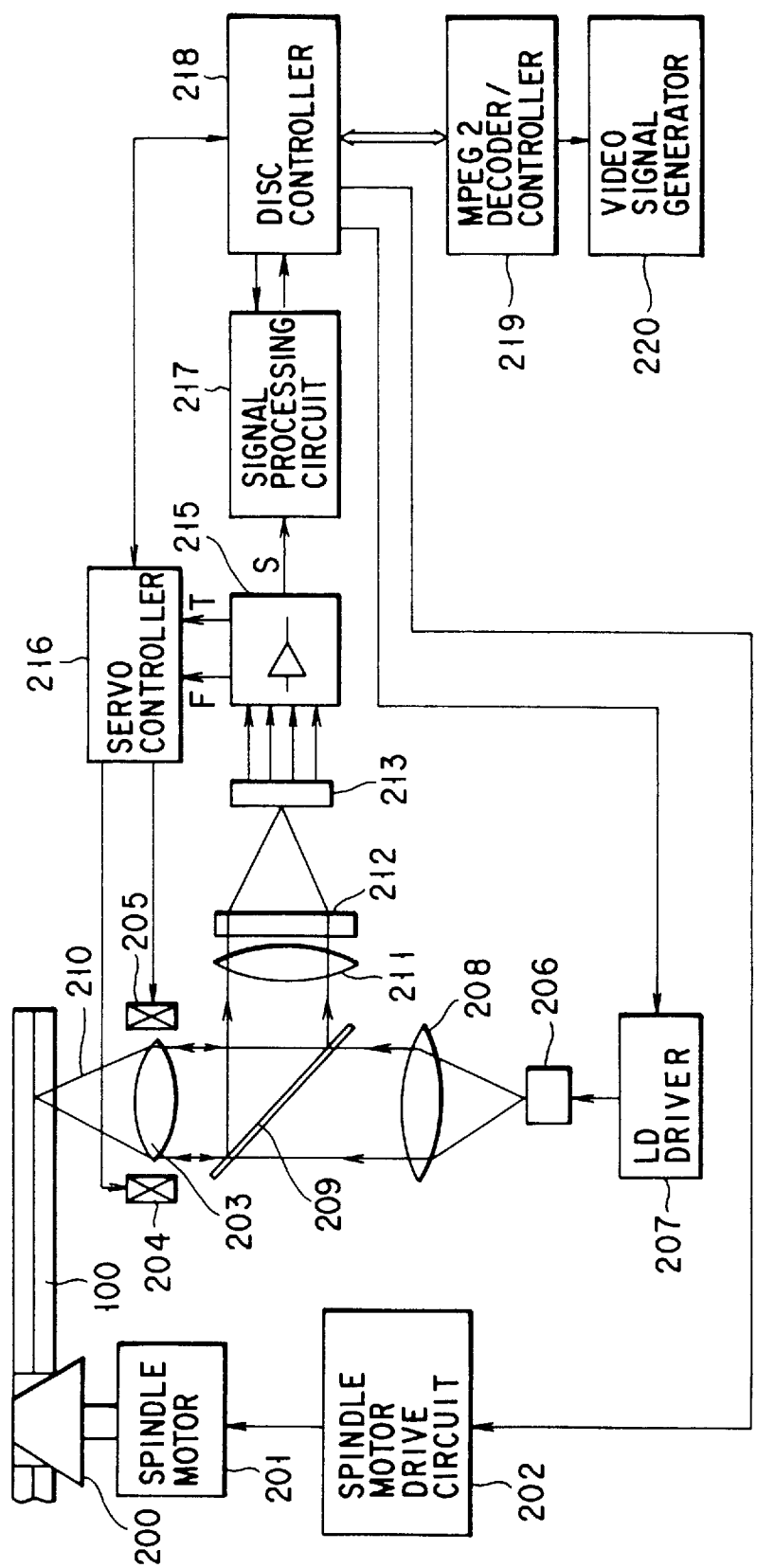
F I G. 1

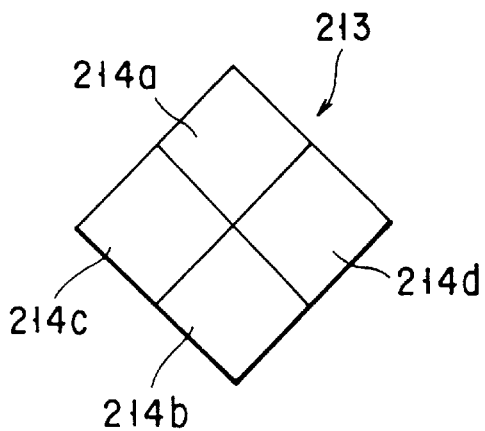
F I G. 5
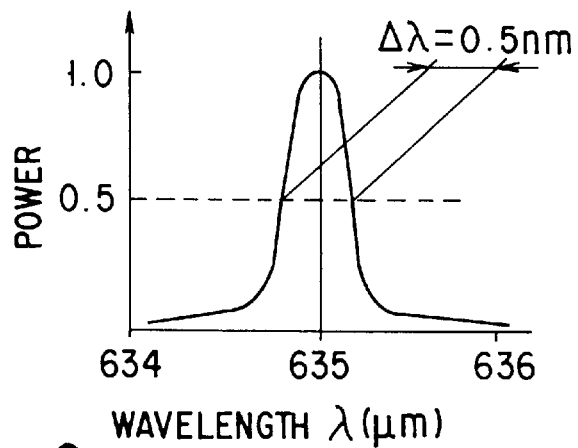
F I G. 6
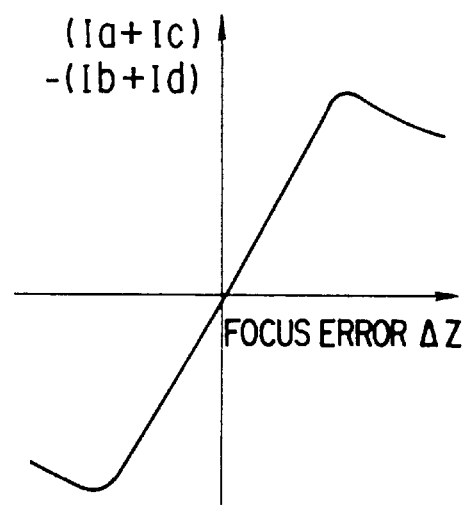
F I G. 7

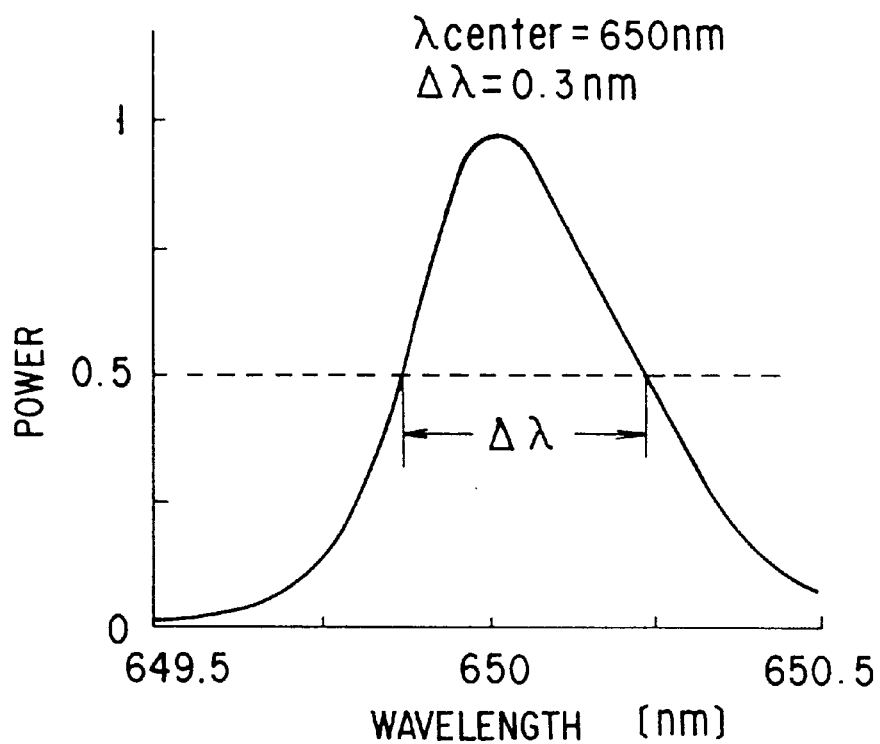
F I G. 10
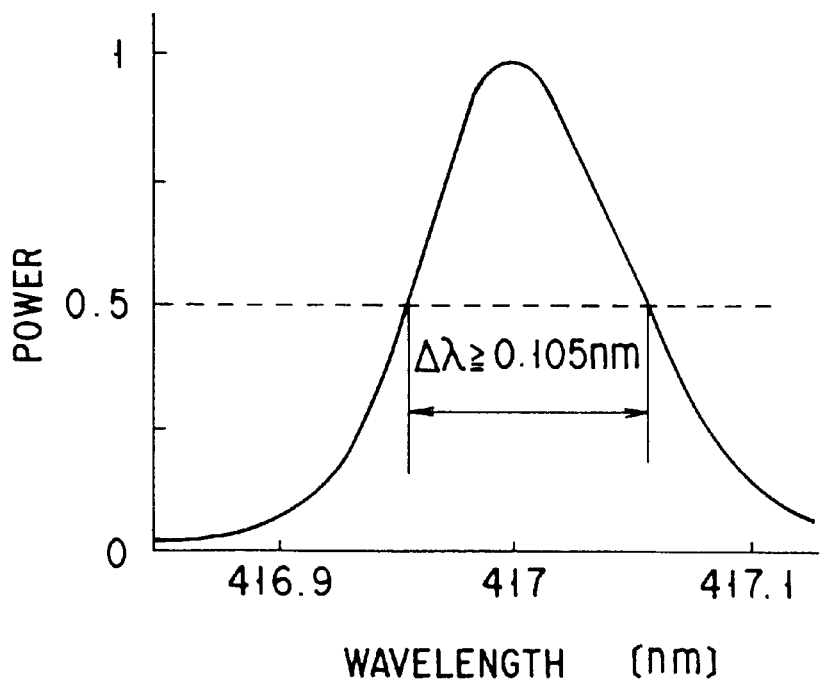
F I G. 11

FOCUSING APPARATUS AND OPTICAL DISK APPARATUS USING THE SAME

BACKGROUND OF THE INVENTION

The present invention relates to a focusing apparatus useful for recording/reproducing signals with respect to a digital versatile disc (hereinafter, referred simply to DVD), and a DVD optical disc apparatus using the focusing apparatus.

In recent years, techniques in digital signal processing, optical disc manufacture, and recording to optical discs have progressed rapidly. Lately, such progress has produced an optical disc when has a recording capacity of several times as much as a conventional compact disc (hereinafter, referred simply to CD) despite having a size the same as that of the aforesaid compact disc.

This optical disc of new type is generally called as DVD and is used to record and reproduce, by means of digital signals, information such as voice, images, programs, and computer-processible data. There is great expectations that DVD will be a general purpose recording medium of the future suitable for the multimedia times.

In the DVD field, there has been already established a worldwide standard (hereinafter, referred simply to DVD standards). According to the such DVD standards, a DVD has the same diameter as that of a CD, which is 120 mm, and has the same thickness as that of a CD, which is 1.2 mm. In order to increase a recording capacity, however, a DVD has a construction in which two discs having a thickness of 0.6 mm are put together so that recording/reproducing can be achieved using both sides of the resultant DVD disc. Meanwhile, a principal wavelength of a laser beam used for recording/reading is 650/635 nm; a Numerical Aperture (NA) of an objective lens used for recording/reading is 0.6; a track pitch is 0.74 $\mu$m; the shortest pit length is 0.4 $\mu$m; and the longest pit length is 2.13 $\mu$m. Such a specification permits a DVD to have a record capacity of 4 giga bites or more on one side of the DVD.

As evident from the foregoing specification of DVD's the depth of a recording layer, namely a depth from the surface of a substrate to a reflective recording layer, is about ½ of the conventional CD. Further, the shortest pit length and the track pitch are about ½ of the CD as well. Moreover, the principal wavelength of a laser beam used for recording/reading is considerably smaller compared to that of 780 a CD which is nm. For this reason, it is very difficult to obtain a focus error signal using the same methods employed for obtaining a focus error signal of the conventional CD.

Specifically, in this type of optical disc, a signal is recorded on the reflective recording layer in the form of a pit. In order to read such a signal from the optical disc, a laser beam is usually radiated onto the rotating optical disc through an objective lens. The radiated light is reflected on the reflective recording layer formed on the optical disc, and, the reflected light is mostly detected, thereby obtaining a recording signal. Simultaneously, a focus error is detected by using part of the aforementioned reflected light, and focusing control for the objective lens is carried out so that the reflective recording layer can be situated in a focus position of the objective lens by using the detected error signal. Whether the of focusing control is good or bad depends upon optical conditions between the objective lens and the reflective recording layer, characteristics of the employed laser beam, etc.

In a DVD player known so far, the focusing control has been carried out according to the same methods employed in the conventional CD player. However, in such methods, a high-precise focusing control can not achieved in certain optical conditions. This causes a problem of lowering the S/N of the reproduction signal and jitter deterioration.

BRIEF SUMMARY OF THE INVENTION

An object of the present invention is to provide a focusing apparatus which is capable of providing focusing control with high precision without being susceptible to optical conditions of an optical disc, and a DVD optical disc apparatus which is capable of carrying out recording/reproducing with high precision using such focusing apparatus.

According to one embodiment of the present invention, an optical disc of the optical disc apparatus is constructed as a recording medium by putting together two substrates with a thickness "h". Each of the two substrates has a signal mark or a reflective layer which is capable of being used as a signal mark at least on the backside of the substrate. A laser beam is radiated onto the optical disc through an objective lens, and the optical disc apparatus is provided with an optical detection device constructed and arranged to detect a reflected light from the reflective layer. One output of the optical detection device is supplied to a signal reader, and the other of the output is supplied to a focusing apparatus to detect a focus error of the objective lens and to control the position of objective lens with respect to the optical disc.

The optical disc apparatus according to this embodiment is characterized in that when a principal wavelength of the laser beam is set as $\Delta\lambda$; a half-width of the laser beam is set as $\Delta\lambda$; a numerical aperture of the objective lens is set as NA; and a refractive index of substrate material constituting the optical disc is set as $n_2$, the half-width $\Delta\lambda$ of the aforesaid laser beam satisfies the equation (1). Expressed in another way, a laser light source emitting the laser beam satisfying the equation (1) is used in the optical disc apparatus according to this embodiment.

$$\Delta\lambda \geq \lambda_0^2/\{2h(n_2^2-NA^2)^{0.5}\} \qquad (1)$$

The half-width $\Delta\lambda$ has an upper limit. Specifically, the half-width $\Delta\lambda$ is limited by the parameters when a laser spot diameter is the maximum allowable laser spot diameter ("dmax"), taking into consideration the chromatic aberration of the objective lens based on $\Delta\lambda$. More specifically, assuming that a focal length of the objective lens is set as f, and a general functional equation for calculating the maximum half-width determined based on a given $\lambda_0$, NA and dmax, is set as g, the upper limit of the half-width is less than g. that is, $\Delta\lambda \geq g$ ($\lambda_0$, NA, F. dmax).

In the optical disc apparatus of the present invention, a laser beam emitted from the laser light source is radiated onto an optical disc after passing through the objective lens. Part of the radiated light is reflected on the surface of the optical disc. The portion of the radiated light reflected on the optical disc is set as $U_1$. On the other hand, the remainder of the radiated light is incident upon a transparent material layer (substrate) forming the outermost portion of the optical disc, and, is thereafter reflected on a reflective layer forming a signal mark, thereby again being emitted from the surface of the optical disc through the transparent material layer. Such emitted light is set as $U_2$.

When the maximum angle of incident luminous flux is set as $\theta_1$ (where, $\sin\theta_1 = NA$); a refractive index of air is set as $n_i$; and a refractive index of the transparent material layer is set as $\theta_2$, an optical-path difference $\Delta L$ between $U_1$ and $U_2$, is obtained from the following equation (2).

$$\Delta L = 2 \cdot n_2 \cdot \cos \theta_2 \qquad (2)$$

Also, according to Snell laws of refraction, the following equation (3) is established.

$$n_1 \sin \theta_1 = n_2 \sin \theta_2 \qquad (3)$$

Meanwhile, a coherent distance Lc of the laser beam is expressed by the following equation (4):

$$Lc = \lambda_0^2 / \Delta\lambda \qquad (4)$$

Thus, if the optical-path difference $\Delta L$ is shorter than the coherent distance Lc, an interference of the light wave is caused between the surface of the optical disc and the reflective layer on the inside thereof. Under such conditions, if the thickness in the circumferential direction or the radius direction of the optical disc or if there is variation in the thickness of the optical disc every maker, the focus error signal varies synchronous with the rotation of the optical disc due to the influence of the interference. As a result, focusing control with high precision cannot be achieved, causing lowering in the S/N of the reproduction signal and jitter deterioration.

The following is a detailed explanation of the influence of variations in the interference strength upon the focus error signal.

If multiple reflection and interference of light wave are caused between the surface of the optical disc and the reflective layer on the inside thereof, the strength Ir of the entire luminance flux emitted toward the side on air having a refractive index n1 from the substrate having a refractive index n2, is expressed by the following equation (5).

$$Ir = \{4R \cdot \sin^2 \cdot \delta/2 . Ii\} / \{(1-R)2 + 4R \cdot \sin^2 \cdot \delta/2\} \qquad (5)$$

Here Ii denotes an incident light strength, R denotes a reflection factor on the interface between air (refractive index $n_1$) and substrate (refractive index $n_2$). Also, $\delta$ concerns with a phase difference between the reflected light $U_1$ on the interface and the reflected light $U_2$ on the reflective layer which is an information recording surface, and it is expressed by the following equation (6).

$$\delta = (2\pi/\lambda_0)\Delta L = (4\pi n_2/\lambda_0) h^* \cos \theta_2 \qquad (6)$$

Based on the equation (2), the above equation (6) is expressed as follows.

$$\delta = (4\pi/\lambda_0) h \cdot (n_2^2 - n_1^2 \sin^2\theta_1)^{0.5} \qquad (7)$$

Based on the equation (5), if the phase difference $\delta$ changes from 0 to $\pi$, it can be seen that the interference strength takes values ranging from O (dark) to the maximum (lightness). Therefore, the period $\Delta h$ of dark/lightness of interference fringes is given by the following equation.

$$\Delta h = \lambda_0 / \{4(n_2^2 - n_1^2 \cdot \sin^2 \theta_1)^{0.5}\} \qquad (8)$$

If substituted $n_1=1$ (air), $n_2=1.5$ (substrate material) $\theta_1=0$ to 36.9 dHeg (according to the DVD standards, NA=0.6=sin $\theta_1$, whereby the maximum incident angle is obtained), for the above equation (8), the minimum and maximum values of the period $\Delta h$ are $\Delta h min = \lambda_0/6$ and $\Delta h max = \lambda_0/5.5'$ respectively.

According to the DVD standards, the principal wavelength $\lambda_0$ of the used laser beam is 650/635 nm. Thus, in the case where a laser beam of the principal wavelength $\lambda_0$=635 nm, $\Delta h min$ is 0.105 $\mu m$; $\Delta h max$ is 0.115 $\mu m$. Therefore, the difference between $\Delta h min$ and $\Delta h max$ is 0.01 $\mu m$. For this reason, the interference strength of luminance flux existing in a range of numerical aperture NA=0.6 varies with respect to the substantially same $\Delta h$ (i.e., unevenness in the thickness of substrate). Also, if the thickness of the substrate varies as the optical disc rotates, the interference fringes changes from lightness to dark in the maximum width; as a result, a focus error signal varies.

However, according to the present invention, a laser beam having a half-width $\Delta\lambda$ satisfying the equation (1) is used. Thus, it is possible to make the coherent distance Lc shorter than the optical-path difference $\Delta L$. As a result, the multiplex interference of light wave between the surface of optical disc and the reflective layer inside the disc can be prevented. Accordingly, the present invention makes it possible to accurately detect the focus error, so that focusing control with high precision can be achieved. Further, lowering in the S/N of reproduction signal and jitter deterioration can be prevented.

Additional objects and advantages of the invention will be set forth in the following descriptions, and in part will be obvious from the descriptions, or may be learned by practicing the invention. Further objects and advantages of the invention may be realized and obtained by means of the instrumentalities and combinations as particularly claimed pointed out in the appended claims.

BRIEF DESCRIPTION OF THE DRAWING

The accompanying drawings, which are incorporated herein and constitute part of the specification, illustrate presently preferred embodiments of the invention, and together with the general description given above and the detailed description of the preferred embodiments given below, explain the principles of the invention.

FIG. 1 is a block configuration diagram of an optical disc apparatus according to the present invention;

FIG. 5 is a front view of an optical sensor which is incorporated into the optical system shown in FIG. 4 and is used for detecting a focus error signal;

FIG. 6 is a diagram showing a power spectrum of a laser diode which records and reads a signal and which used for focusing control incorporated into the optical system shown in FIG. 4;

FIG. 7 is a diagram showing a focus error signal detected in the apparatus shown in FIG. 1;

FIG. 10 is a diagram showing a power spectrum of another laser diode which is applicable to the optical disc apparatus according to the present invention;

FIG. 11 is a diagram showing a power spectrum of still another laser diode which is applicable to the optical disc apparatus according to the present invention;

DETAILED DESCRIPTION OF THE INVENTION

In FIG. 1, there is shown an optical disc apparatus according to the present invention, that is, a DVD player.

Figure 2:
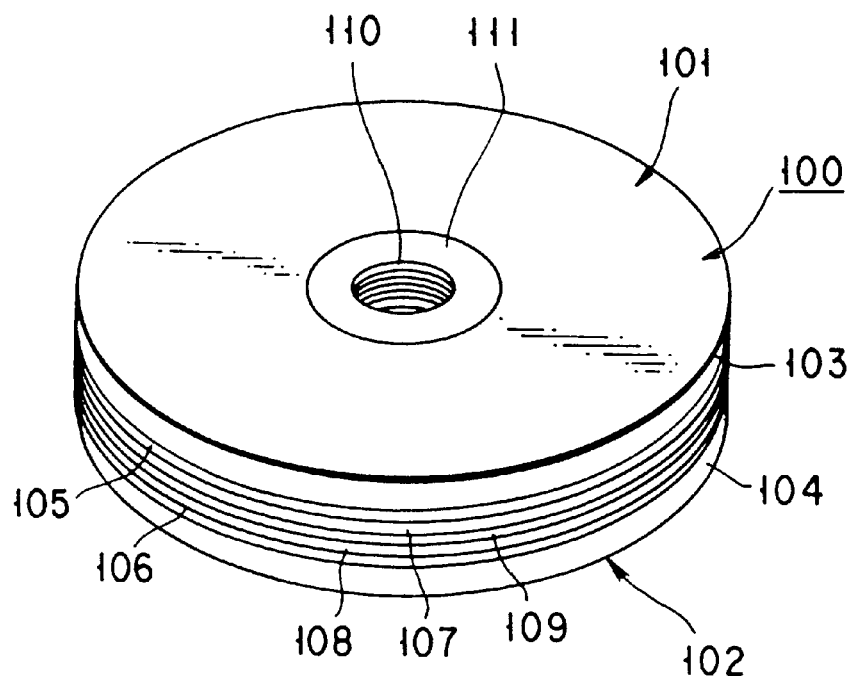
FIG. 2 is a perspective view of a DVD used as a recording medium in the apparatus shown in FIG. 1.
Figure 3:
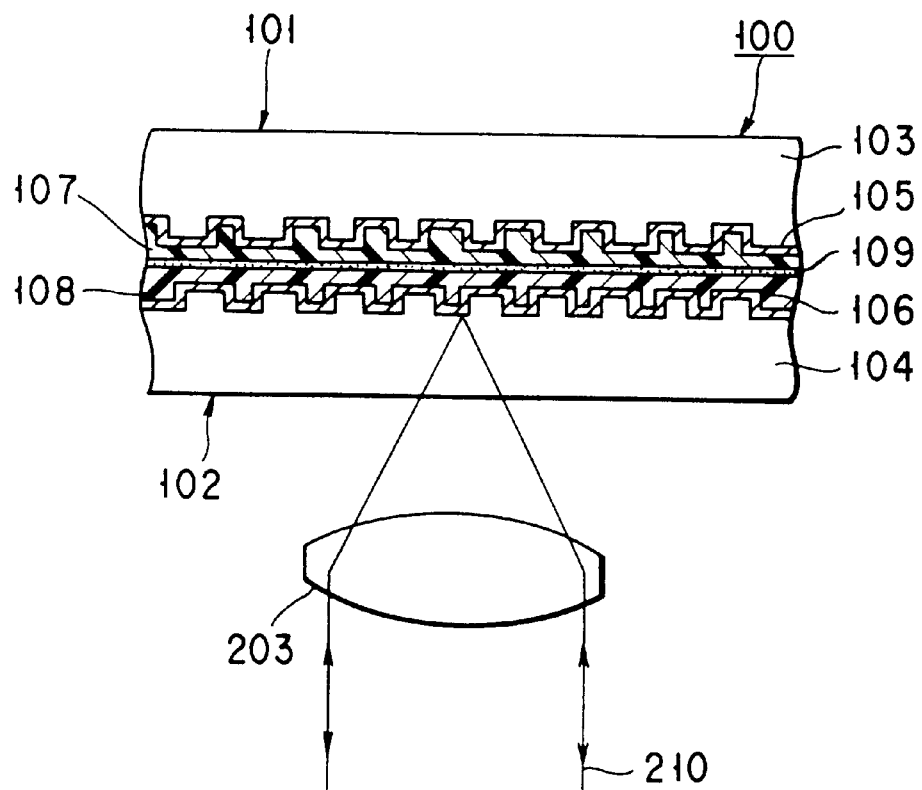
FIG. 3 is a partially sectional view of the DVD shown in FIG. 2.

A reference numeral 100 denotes a DVD used as an optical disc. The DVD 100 is manufactured according to the DVD standards, and more particularly, is formed as shown in FIGS. 2 and 3.

Specifically, the DVD 100 comprises disc-like formed first and second information recording members 101 and 102 which are put together, and is formed so as to have a thickness of 1.2 mm as a whole. The first and second information recording members 101 and 102 include transparent substrates 103 and 104, respectively. These transparent substrates 103 and 104 includes reflective layers 105 and 106 on their backsides, respectively. The reflective layers individually have pits corresponding to recording information such as a compressed motion picture, and make a light reflect. These reflective layers 105 and 106 are provided with protective layers 107 and 108 for preventing reflective layers from being oxidized, at their upper surfaces, respectively. The first and second information recording members 101 and 102 are put together by means of an adhesive layer 109 which is interposed between the protective layers 107 and 108. The adhesive layer consists of an thermosetting adhesive agent. Also, the DVD has a clamping hole 110 for clamping at the center thereof. The circumference of the clamping hole is formed with a clamping zone 111.

The following is an explanation about material quality of members constructing the DVD 100. The transparent substrates 103 and 104 are made of a polycarbonate resin or a resin including polycarbonate or PMMA (poly-methyl methacrylate). The reflective layers 105 and 106 are formed of thin aluminum film. The protective layers 107 and 108 are formed of an optical hardening resin (ultraviolet hardening resin). The adhesive layer 109 consists of a hot melt bonding agent (thermoplastic resin bonding agent), for example, poly-vinyl ether paraffin based material; [—CH$_2$—CH=CH—CH$_2$]$_n$—[CH$_2$—CH(OCH$_3$)—]$_n$'.

In the optical disc apparatus shown in FIG. 1, the DVD 100 is rotated by means of a spindle motor 201 at a rotating speed of 1350 (rpm), for example, in a state of being chucked onto a taper cone 200. The spindle motor is driven by means of a spindle motor drive circuit 202.

On the other hand, a record/reproduction optical system is constructed as follows. Specifically, an objective lens 203 is arranged opposite to one side of the DVD 100. The objective lens 203 is controlled so that it is movable in an optical axis direction by means of a focus coil 204 and movable in a track widthwise direction by means of a tracking coil 205. Also, a semiconductor laser diode (hereinafter referred simply to LD) 206 is arranged at the position opposite to the objective lens 203 so that the laser diode is movable together with the objective lens 203. This LD 206 is urged by means of a LD diver 207.

A laser beam emitted from the LD 206 is converted into a parallel luminous flux by means of a collimate lens 208, and then, is incident upon a polarizing beam splitter 209. The laser beam emitted from the LD 206 generally has an ellipse far field pattern. If a circular patter is necessary, a beam shaping prism (not shown) may be arranged behind the collimate lens 208.

Figure 4:
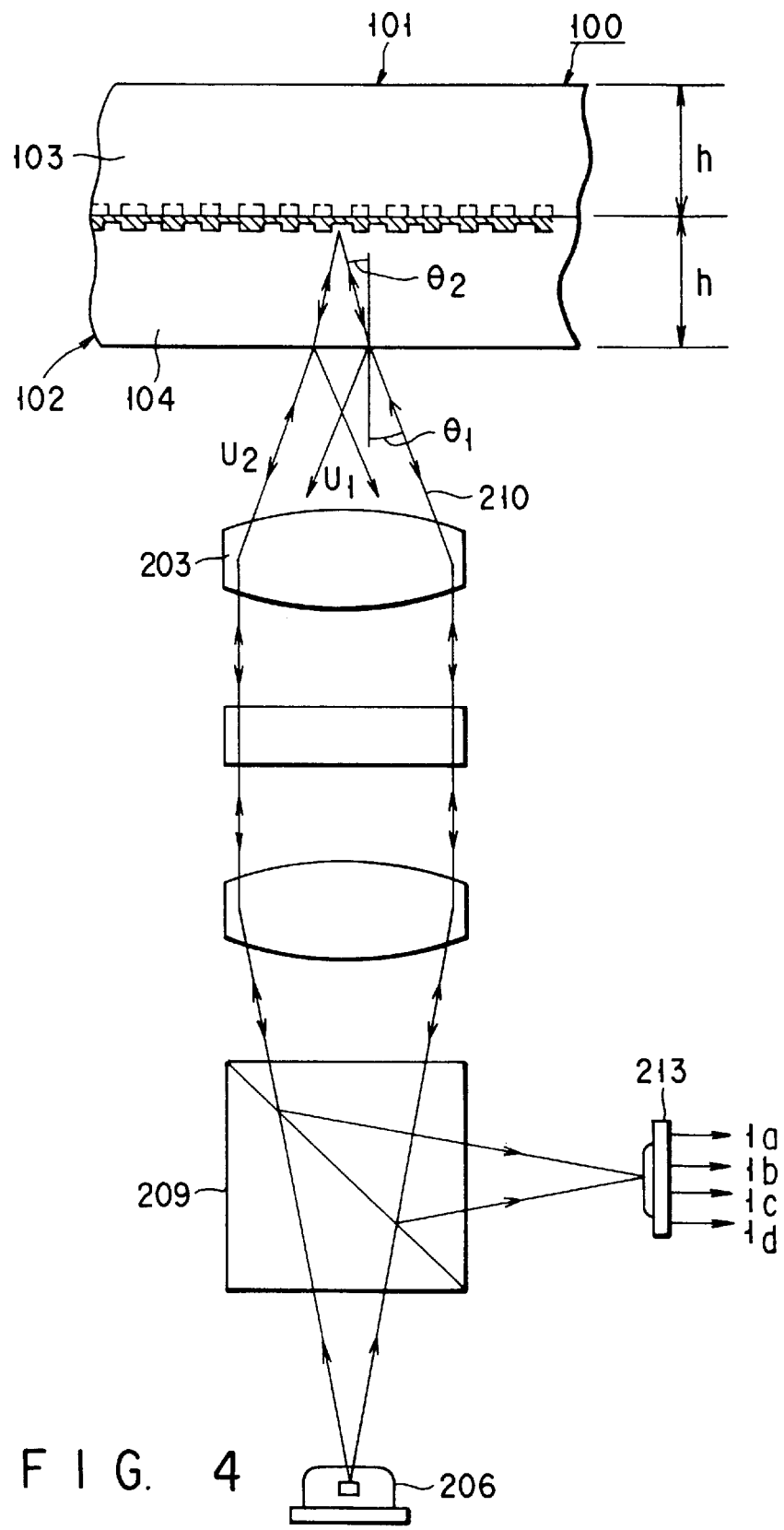
FIG. 4 is a view showing an optical system of the apparatus shown in FIG. 1.
Figure 8:
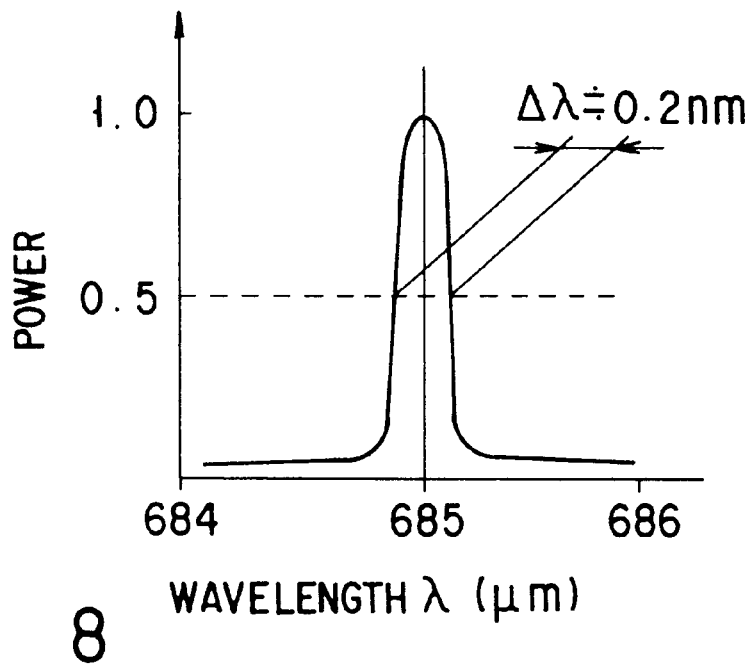
FIG. 8 is a diagram showing a power spectrum of a laser diode which is not applicable to the optical disc apparatus according to the present invention

The laser beam passing through the polarizing beam splitter 209 is converged by means of the objective lens 203, and then, is incident upon the transparent substrate 103 or 104 of the DVD 100, as shown in FIGS. 3 and 4. In this embodiment, the numerical aperture NA of the objective lens is 0.6 based on the DVD standards.

Next, the following is an explanation about light emitting characteristics of the LD 206, that is, a power spectrum of the LD 206. Specifically, as seen from FIG. 4, assuming that a thickness of the transparent substrate 104 (103) is set as "h", the maximum angle of a luminous flux 210 incident upon the transparent substrate 104 (103) is set as $\theta_1$ (where, sin $\theta_1$=NA); a refractive index of air is set as $n_1$; a refracting angle in the transparent substrate 104 (103) is set as $\theta_2$; a laser beam emitted from the LD 206, that is, a principal wavelength of incident luminous flux 210 is set as $\lambda_0$; and a half-width of the principal wavelength is set as $\Delta\lambda$, a laser diode LD 206 satisfies the following equation:

$$\Delta\lambda \geq \lambda_0^2/\{2h(n_2^2-NA^2)^{0.5}\}$$

For example, as shown in FIG. 6, a laser diode, in which principal wavelength $\lambda_0$ equals 635 nm and a half-width $\Delta\lambda$ equals 0.5 nm is used.

During reproduction, the laser beam incident upon the transparent substrate 104 (103) through the objective lens converge as a micro beam spot on the reflective layer 106 (105). Then, the reflected light from the reflective layer 106 (105) passes through the objective lens in the direction opposite to the incident light, and thereafter is reflected by the polarizing beam splitter 209, thus being incident upon an optical sensor 213 via a detection optical system that includes a condensed lens 211, a cylindrical lens 212, etc.

The optical sensor 213 is composed of four optical detection elements 214a to 214d arranged on a same plane, as shown in FIG. 5. Four detection outputs from the optical sensor 213 is inputted to an amplifier array 215 that includes an amplifier, adder-subtracter, etc. A focus error signal F. a tracking error signal T and a reproduction signal S are thereby generated.

The above tracking error signal T is obtained by a known method, called a push-pull method.

Also, the focus error signal F is obtained by an astigmatic aberration method. According to the astigmatic aberration method, a focus error signal is obtained in the following manner. Among optical detection elements shown in FIG. 5, outputs I$a$ and I$b$ of optical detection elements 214a and 214b situated on the diagonal line are added together. From the addition signal, a signal, which is addition of outputs I$c$ and I$d$ of optical detection elements 214c and 214d, is subtracted. A thus a focus error signal is thus obtained from the subtraction signal.

The focus error signal F and the tracking error signal T are supplied to the focus coil 204 and the tracking coil 205, respectively, via a servo controller 216. The objective lens 203 is thereby controlled so that it is movable in the optical axis direction and in the track widthwise direction. Thus, focusing of a light beam with respect to the reflective layer 106 (105) which is a recording plane of the DVD 100, and tracking with respect to a target track are being carried out.

On the other hand, the reproduction signal S from the amplifier array 215 is inputted to a signal processing circuit 217, and is subjected to wave form equalization and binm digit processing. In the binm digit processing, the reproduction signal subjected to wave form equalization is guided to a PLL (Phase-Locked Loop) and a data identification circuit. The PLL extracts a channel clock which is a basic clock when recording information in the DVD 100, from the reproduction signal. Then, based on the channel clock, whether the reproduction signal is "0" or "1" is identified, and data identification of information recorded in the DVD 100 is executed. Accordingly, thereby a data pulse is obtained. Specifically, the reproduction signal after wave form equalization is compared with a proper threshold value within a predetermined time width (referred to as a detection window width or a window width), based on the timing of a rise-up or fall of the channel clock, carrying out data identification.

The data pulse thus detected from the signal processing circuit 217 is inputted to a disc controller 218, and, is subsequently inputted to an MPEG2 decoder/controller 219 as a bit stream of motion picture information. Pursuant to the MPEG2 standards, the data compressed and encoded motion picture information is recorded as a pit pattern on the reflective layers 105 and 106 in the DVD 100. The aforesaid MPEG2 decoder/controller 219 decodes (expanding) the inputted pit stream to reproduce the original motion picture information.

The motion picture information thus produced is inputted to a video signal generator circuit 220, and then, a blanking signal and the like are added thereto. The motion picture information is thereby converted into a video signal having a predetermined television format, such as NTSC format, and is displayed by a display device (not shown).

As described before, the DVD optical disc apparatus uses the LD 206 which has light emitting characteristic satisfying the requirements of the aforementioned equation (1), so that the coherent distance Lc expressed by the aforementioned equation (4) can be shortened with respect to the optical-path difference AL. As a result, a coherent light can be prevented from being generated between the surface of the DVD 100 and the reflective layer 105 (106) inside of the DVD.

To give an example of numerical values, the LD 206 emits a laser beam of principal wavelength $\lambda_0$=635 nm and half-width $\Delta\lambda$=0.5 nm. In such a case, the coherent distance Lc of the laser beam is 0.8 mm, from the equation (4). The DVD 100 has information recording members 101 and 102 with a thickness "h" of 0.6 mm are put together, according to the DVD standards. Also, the numerical aperture NA of the objective lens 203 is set to 0.6 according to the DVD standards. Thus, in the case where the transparent substrates 103 and 104 constituting information recording member 101 and 102 are individually composed of poly carbonate having a refractive index $n_2$=1.5, the optical-path difference AΔL is 1.650 mm from the equation (2).

As described above, the LD emits a laser beam having a half-width $\Delta\lambda$ satisfying the equation (1). Therefore, the coherent distance Lc can be made shorter than the optical-path difference $\Delta L$; as a result, a multiple coherent light can be prevented from being generated between the surface of the DVD 100 and the reflective layer. Thus, it is possible to obtain a focus error signal which changes linearly as shown in FIG. 7 with respect to the focus direction displacement $\Delta Z$ of the objective lens 203. This serves to achieve focusing control with high precision, and to prevent the S/N of production signal from lowering and jitter deterioration.

Figure 9:
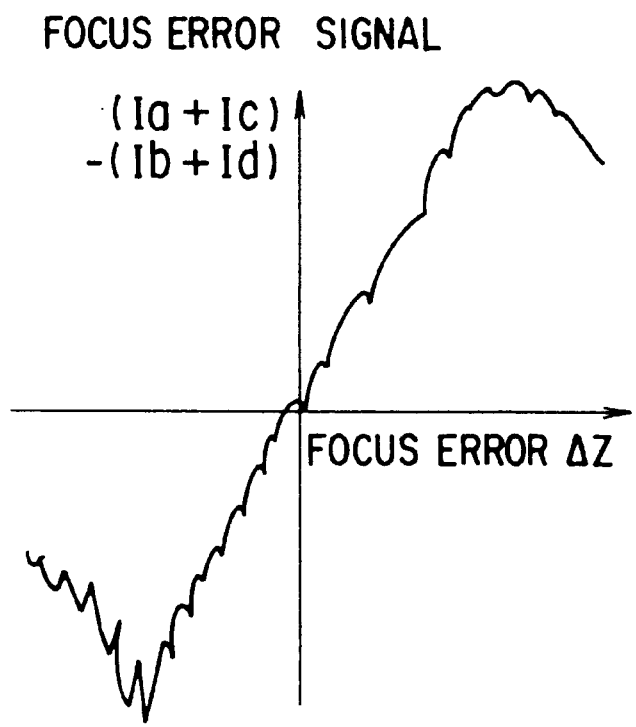
FIG. 9 is a diagram showing a focus error signal obtained when the laser diode having characteristic shown in FIG. 8 is used.

If a laser beam used has a half-width $\Delta\lambda$ which does not satisfy the equation (1), for example, a laser beam of principal wavelength $\lambda_0$=685 nm and half-width $\Delta\lambda$=0.2 nm, the result is as follows. In such a case, the coherent distance Lc is 2.34 mm; on the other hand, the optical-path difference $\Delta L$ becomes further longer than 1.650 mm. For this reason, the interference of $U_1$ with $U_2$ is not prevented (see FIG. 5). As a result, only a focus error signal which changes as pulsed with respect to the focus direction displacement AZ of the objective lens 203 is obtained, as shown in FIG. 9.

As is evident from the above explanation, the optical disc apparatus using a DVD as recording medium, or an optical disc apparatus handling a high definition DVD, which is expected to appear in near future, needs to avoid the interference of $U_1$ with $U_2$ in order to achieve record/reproduction with higher precision. To achieve it, even if the thickness of DVD is uneven, it is necessary that the optical-path difference $\Delta L$ is always longer than *he coherent distance Lc. In order to shorten the coherent distance Lc, it is desirable to use a laser diode having a large value of half-width $\Delta\lambda$.

FIG. 10 shows an example of a power spectrum of a laser diode capable of meeting this demand. As seen from the figure, the LD emits a laser beam having principal wavelength $\lambda_0$=650 nm and half-width $\Delta\lambda$=0.3 nm. The coherent distance Lc of this LD is 1.408 mm based on computation; on the other hand, the optical-path difference $\Delta L$ thereof becomes even more shorter than 1.65 mm. Therefore, interference of $U_1$ with $U_2$ can be prevented.

Also, an optical disc apparatus handling a high-definition DVD needs to use a laser beam having principal wavelength $\lambda_0$=417 nm, or its substantial equivalent. Subsequently, in order to calculate the required half-width $\Delta\lambda$, values of $\lambda_0$=417 nm, h=0.6 mm and $n_2$=1.5, are substituted in the equation (1); whereupon a relation of $\Delta\lambda \geq 0.105$ nm is obtained. Specifically, the optical disc apparatus handling a high-definition DVD requires a laser beam having a principal wavelength $\lambda_0$ of 410 nm to 420 nm and a half-width $\Delta\lambda$ of 0.105 nm or more.

For the optical disk apparatuses to be developed with the advent of the high-definition DVD, a half-width value 61 for preventing interference between $U_1$ and $U_2$ can be obtained from the equation (1).

In the above embodiment, an optical disk for a DVD. player has been described by way of example. However, this invention is applicable to a ROM (DVD-ROM), a RAM (DVD-RAM), etc. for recording and reproducing programs and computer-processible data.

Figure 12:
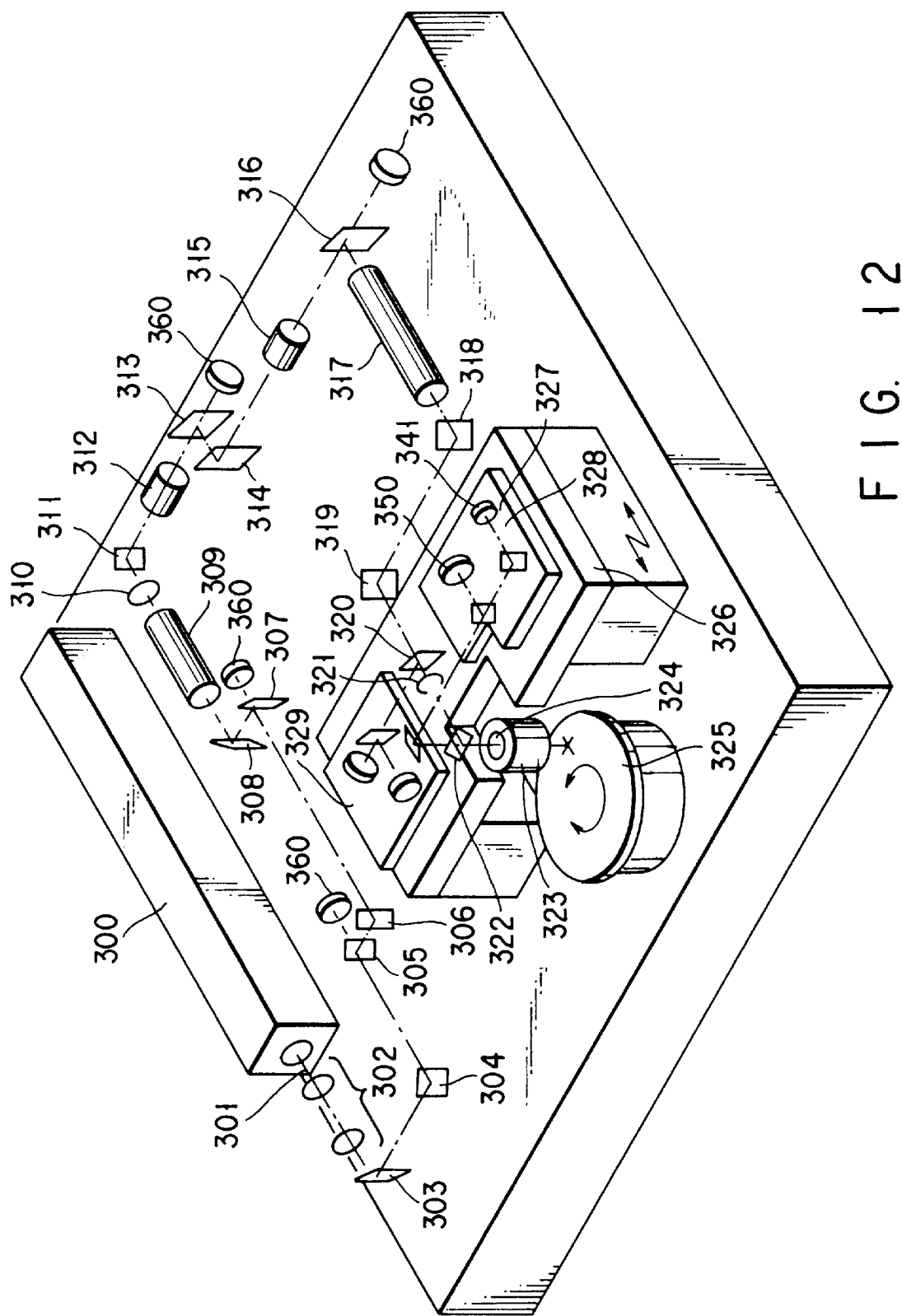
FIG. 12 is a view schematically showing a configuration of a DVD master disc manufacturing machine into which a focusing apparatus according to the present invention is incorporated.

In FIG. 12, there is shown a master disc recording apparatus for an optical disc, which is provided with the focusing apparatus of the present invention. The master disc recording apparatus is used in a process of subjecting a record to a resist master disc to which photoresist is applied at the initial stage of manufacturing the original disc.

A reference numeral 300 generally denotes a light source. The light source 300 comprises a $Kr^+$ laser tube (wavelength=351 nm). A laser beam 301 emitted from the light source 300 is shaped into a parallel beam by means of a series of lens 302, and then is reflected by means of mirrors 303 to 308. Further, alternating current noise of optical power of the beam is removed by means of an electro-optical modulation device 309. Subsequently, the laser beam passes through a wavelength plate 310, and then, is reflected by a mirror 311. Furthermore, a direct current composition of optical power of the beam is stabilized by means of an acousto-optic modulation device 312; and then, is reflected by means of mirrors 313 and 314; and substantially, is modulated by means of an acoustooptic modulation device 315 in accordance with information to be recorded. In FIG.

12, a control system for controlling the acousto-optic modulation device 315 is omitted therein.

A recording light beam is reflected by means of a mirror 316, and its beam diameter is enlarged by means of an enlargement optical system 317. Further, the enlarged beam is reflected by mirrors 318 and 319, and passes through a polarizing beam splitter 320 and a λ/4 plate 321. Furthermore, the beam is reflected by a dichroic mirror 322, and then, is converged by means of an objective lens 324 disposed in an objective lens unit 323. Thus, a recording spot is formed on a photosensitive agent surface of a master disc 325 for an optical disc.

A recording portion is formed on the photosensitive agent surface of the master disc for an optical disc 325 by means of the aforesaid recording spot. The recording portion is formed on a spiral-like track by rotation of the master disc for an optical disc 325 and by movement in the radius direction of a slide 326 supporting the objective lens unit 323. During this rotation, the objective lens 324 is controlled by means of a focusing apparatus 327 so that the focus of the objective lens is always situated onto the photosensitive agent surface of the master disc 325. The master disc 325 for an optical disc, in which information is recorded, is subjected to a developing process so that pits are formed in the recording portion, and, is plated thereafter with silver to be used as a disc master.

The aforesaid focusing apparatus 327 comprises a coarse control system 328 for coarsely adjusting the position of objective lens 324 before recording is started; and a fine control system 329 for finely adjusting the position of objective lens 324 by using the recording light during recording.

Figure 13:
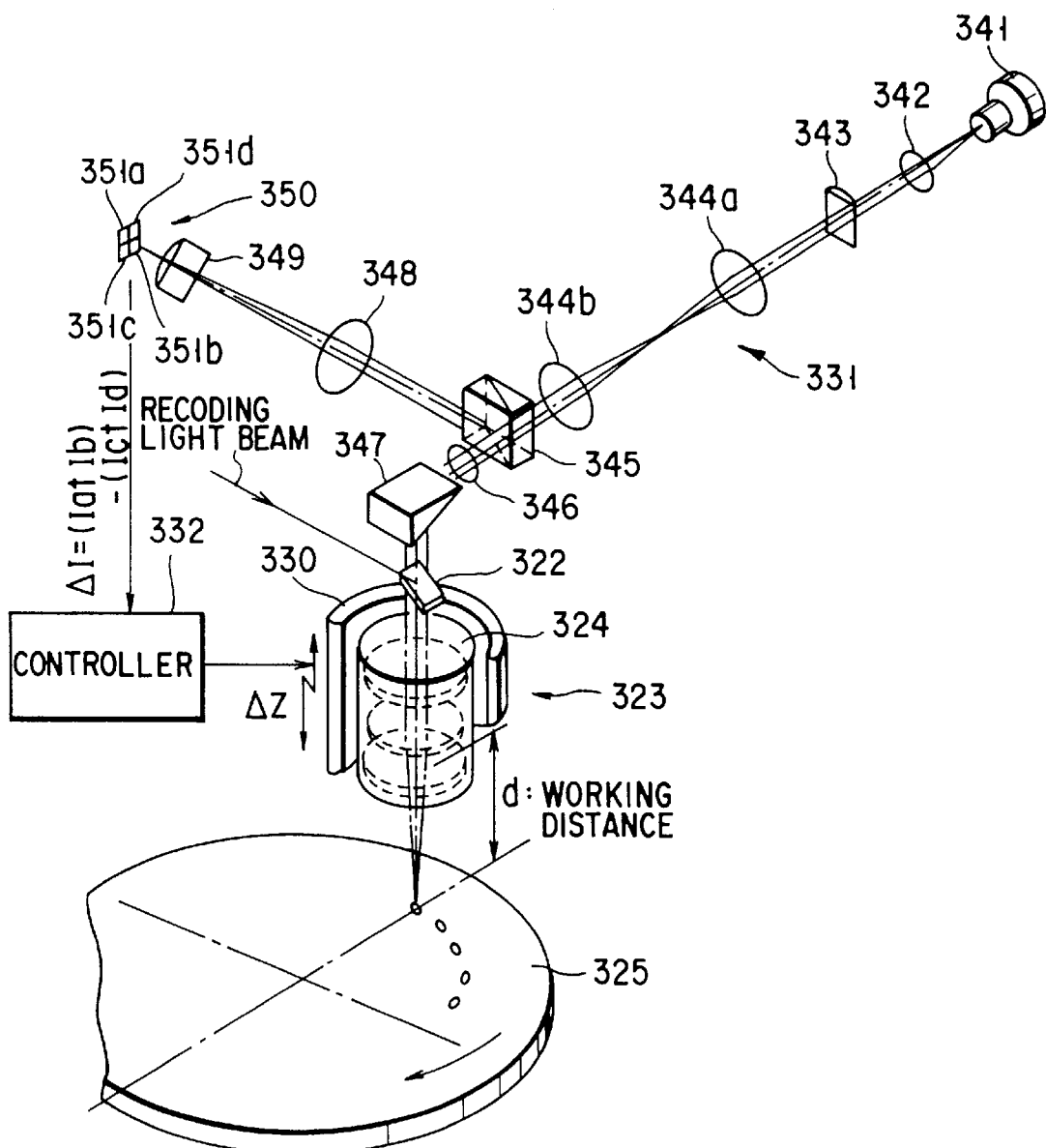
FIG. 13 is a view showing principal parts of the focusing apparatus incorporated into the machine shown in FIG. 12.

As shown in FIG. 13, the coarse control system 328 includes: an objective lens actuator 330 constructed and arranged to adjust the position of objective lens 324 in the optical axis direction; a focus error sensing optical system 331 constructed and arranged to optically sense a focus error in the objective lens 324; and a controller 332 constructed and arranged to control the objective lens actuator 330 on the basis of a signal obtained from the sensing optical system 33 1.

The focus error sensing optical system 331 is an optical system employing an astigmatic aberration method and comprises: a light source 341, a collimate lens 342, a cylindrical lens 343, relay lenses 344a and 344b, a polarizing beam splitter 345, a λ/4 plate 346, a mirror 347, a spherical lens 348, a cylindrical lens 349 and a four-divided light receiving device 350.

The light source 341 emits a divergently ellipse light beam. The light beam is converted into a slightly converged light beam by means of the collimate lens 342, and is then shaped into a circular light beam by means of the cylindrical lens 343. Thereafter, the light beam passes through the relay lens 344a and 344b, and is incident upon the polarizing beam splitter 345. A laser beam emitted from the light source 341 is a linearly polarized light and is set as a P wave. Thus, the light beam incident upon the polarizing beam splitter 345 transmits therethrough, and is then converted into a clockwise circularly polarized light. Further, the light beam is reflected by the mirror 347, and transmits through the dichroic mirror 322, thereby being focused on the master disc 325 by means of the objective lens 324.

The reflected beam from the master disc 325 gains a reverse rotation, that is, counterclockwise circularly polarized light, and is incident upon the objective lens 324. Further, the reflected beam transmits through the dichroic mirror 322 and is reflected by the mirror 347, thus being converted into an S wave by means of the λ/4 plate 346. Thereafter, the reflected beam is reflected by the polarizing beam splitter 345 and is then converted into a convergent light beam by means of the spherical lens 348. Subsequently, the convergent light beam is incident upon the four-divided light receiving device 350 via the cylindrical lens 349. The light receiving elements 351a, 351b, 351c and 351d of the four-divided light receiving device 350 output signals Ia, Ib, Ic and Id, respectively, corresponding to light receiving quantity.

The aforesaid controller 332 introduces respective signals Ia to Id of the four-divided light receiving device 350, and executes an operation of (Ia+Id)−(Ic+Id) on the basis of the astigmatic aberration method. From the operation, a focus error signal indicative of a defocus quantity is obtained. Further, the controller 332 executes feedback control with respect to the objective lens actuator 330 so as to make the focus error signal maintained at zero. Accordingly, the objective lens 324 is controlled in position so that its focal point is always situated on the photosensitive agent surface of the master disc 325.

The master disc recording apparatus shown in FIG. 12 is used for the purpose of manufacture of a master disc, for example, having a track pitch of 0.74 μm. Thus, a lens used as the objective lens 324 in the apparatus has a numerical aperture NA=0.9, a focal length f=4.002 mm (wavelength: 351 nm). The working distance d (a length from the translucent parallel plate attached to the lowest surface of the objective lens 324 to the surface of the master disc 325) is 350 μm.

Figure 14:
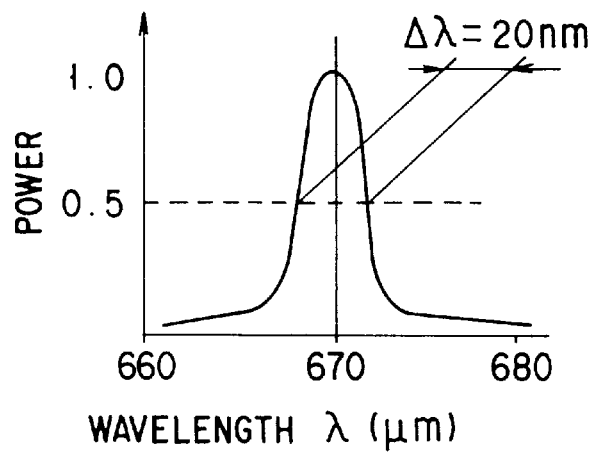
FIG. 14 is a view showing a power spectrum of a laser diode built in the focusing apparatus shown in FIG. 13 and used for focusing control.

In the coarse control system 328 of the focusing apparatus 327, a light source 341 is used a SLD (e.g., Super Luminescent Diode, manufacture of Anritsu Kabushiki Kaisha) as shown in FIG. 14. The power spectrum of the SLD has a principal wavelength $\lambda_0$=670 nm and a half-width Δλ=20 nm. Therefore, the coherent distance Lc of the light beam emitted from the SLD is 22 μm based on the equation (4).

As described above, in the coarse control system 328, the light source 341 having power spectrum capable of sufficiently making short the coherent distance Lo is used, as compared with the working distance d of the objective lens 324. Specifically, the light source 341, which can substantially meet the condition, $\lambda_0^2/\Delta\lambda \geq 2d$, is used. Thus, multiple interference of light wave can be prevented from being generated between a transparent protective plate arranged at the front of the objective lens 324 and the master disc 325. As a result, in the controller 332, it is possible to obtain a focus error signal which changes linearly as shown in FIG. 7 with respect to the focus direction displacement ΔZ of the objective lens 324, like the earlier mention embodiment. Therefore, focusing control with high precision can be achieved.

As seen from the above explanation, even in the case where the focusing apparatus applied to the master disc recording apparatus having a short working distance, a noiseless focus error signal can be obtained. As a result, focusing control can be carried out with high precision, and, thus enabling manufacture of high quality master discs. Incidentally, in the fine control system 329, a recording light is used in recording, and focusing control is carried out according to the astigmatic aberration method. In FIG. 12, a reference numeral 360 generally denotes an optical detector for checking a light quantity.

Figure 15:
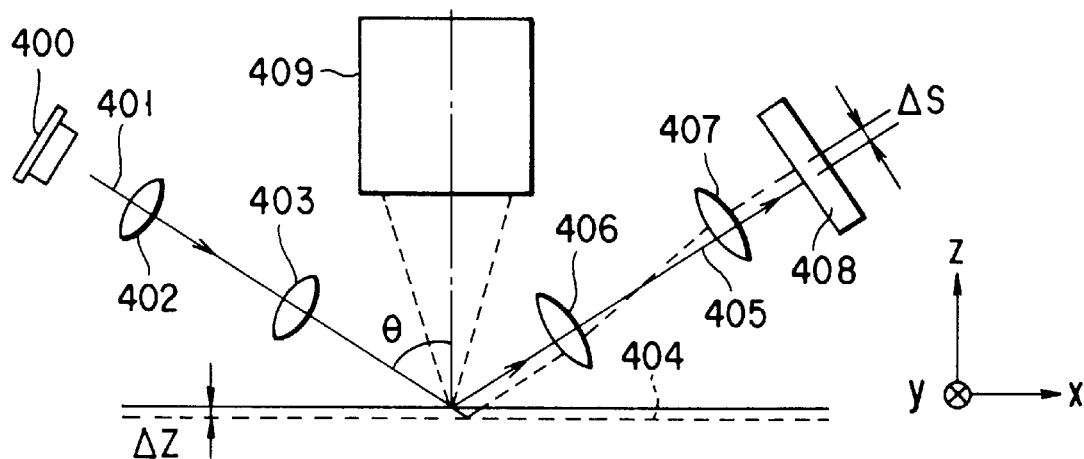
FIG. 15 is a view schematically showing a configuration of an exposure system into which another focusing apparatus according to the present invention is incorporated.

FIG. 15 shows an exposure apparatus having the focusing apparatus according the present invention.

The exposure apparatus obliquely radiates a laser beam 401 emitted from a LO 400 onto the surface of a test material, such as wafer, via lenses 402 and 403. A reflected light 405 from the surface of the test material 404 is introduced into an optical transmission type position detector 408, and then, the surface position of the test material 404 is detected by a position detector 408. Subsequently, the detected surface position information is supplied to a position control system of an exposure apparatus body 409 or a position control system of a test material holder. Focusing control system is constituted in the manner that a focal position of the exposure apparatus body 409 is always situated on the surface position of the test material.

Also, in the exposure apparatus, a laser diode such as the aforementioned LD having a sufficiently great half-width $\Delta\lambda$ is used as the LD 400. Specifically, the laser diode used as the LD 400 has a principal wavelength $\lambda_0$ and a half-width $\Delta\lambda$, whereby the resultant power spectrum substantially satisfies the equation $\lambda_0^2 \Delta\lambda \leq 2t(n_2^2 - \sin^2\theta)^{0.5}$, with respect to a thickness t of an optical medium covering the test material 404. In this case, $n_2$ denotes a refractive index of the optical medium and $\theta$ denotes a light incidence angle to the optical medium. Therefore, focusing control can be carried out without being under the influence of the optical medium covering the test material 404.

Additional advantages and modifications will be obvious to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. An optical disc apparatus comprising:
   a laser beam source constructed and arranged to emit a laser beam;
   an optical disc having two substrates,
   one of said substrates being disposed on the other of said, substrates,
   each of said substrates having a thickness h, and
   at least one of said two substrates having a reflective layer having a signal pit at a distance of nearly h from a surface of said reflective layer, said reflective layer being constructed and arranged to reflect the laser beam;
   an objective lens constructed and arranged to radiate the laser beam emitted from said laser beam source on said optical disc, thereby recording or reproducing information on said optical disc; and
   a focus error detecting unit constructed and arranged to detect a focus error of said objective lens based on signal obtained by sensing part of the laser beam reflected from said reflective layer, wherein
   when a principal wavelength of the laser beam from said laser beam source and a half-width of the laser beam from said laser beam source are set as $\lambda_0$ and $\Delta\lambda$, respectively,
   a numerical aperture of said objective lens is set as NA, and
   a refractive index of a material comprising said at least one of said substrates is set as $n_2$;
   the half-width $\Delta\lambda$ of the laser beam from said laser beam source satisfies the following equation:

$$\lambda_0^2/\{2h(n_2^2-NA^2)^{0.5}\} \leq \Delta\lambda.$$

2. The optical disc apparatus according to claim 1, wherein each of said substrates has a thickness of 0.6 mm and a diameter of 120 mm.

3. The optical disc apparatus according to claim 1, wherein said laser beam source comprises a semiconductor laser diode.

4. The optical disc apparatus according to claim 1 or claim 3, wherein the principal wavelength $\lambda_0$ of the laser beam ranges from 635 nm to 650 nm and the half-width $\Delta\lambda$ of the laser beam is 0.3 nm or more.

5. The optical disc apparatus according to claim 1 or claim 3, wherein the principal wavelength $\lambda_0$ of the laser beam ranges from 410 nm to 420 nm and the half-width $\Delta\lambda$ of the laser beam is 0.105 nm or more.

6. An optical disc apparatus comprising:
   a laser beam source constructed and arranged to emit a laser beam;
   an optical disc having two substrates,
   one of said substrates being disposed on the other of said substrates,
   each of said substrates having a thickness h, and
   at least one of said two substrates having a reflective layer having a signal pit at a distance of nearly h from a surface of said reflective layer, said reflective layer being constructed and arranged to reflect the laser beam;
   an objective lens constructed and arranged to radiate the laser beam emitted from said laser beam source on said optical disc, thereby recording or reproducing information on said optical disc; and
   a focus error detecting unit constructed and arranged to detect a focus error of said objective lens based on a signal obtained by sensing part of the laser beam reflected from said reflective layer, wherein
   when a principal wavelength of the laser beam from said laser beam source a half-width of the laser beam from said laser beam source are set as $\lambda_0$ and $\Delta\lambda$, respectively,
   a numerical aperture of said objective lens is set as NA,
   a focal length of said object lens is set as f,
   a refractive index of a material comprising said at least one of said substrates is set as $n_2$,
   a maximum diameter of the laser beam radiated to said signal pit is set as dmax, and
   a functional equation for calculating the maximum half-width determined based on $\lambda_0$ NA, f and dmax is set as g;
   the half-width $\Delta\lambda$ of the laser beam from said laser beam source satisfies the following equation:

$$\lambda_0^2/\{2h(n_2^2-NA^2)^{0.5}\} \leq \Delta\lambda \leq g(\lambda_0, NA, f, d\text{max}).$$

7. The optical disc apparatus according to claim 6, wherein each of said substrates has a thickness of 0.6 mm and a diameter of 120 mm.

8. The optical disc apparatus according to claim 6, wherein said laser beam source comprises a semiconductor laser diode.

9. The optical disc apparatus according to claim 6 or claim 7, wherein the principal wavelength $\lambda_0$ of the laser beam ranges from 635 nm to 650 nm and the half-width $\Delta\lambda$ of the laser beam is 0.3 nm or more.

10. The optical disc apparatus according to claim 6 or claim 7, wherein the principal wavelength $\lambda_0$, of the laser beam ranges from 410 nm to 420 nm and the half-width $\Delta\lambda$ of the laser beam is 0.105 nm or more.

11. An optical disc apparatus comprising:
    a laser beam source constructed and arranged to emit a laser beam;

an optical disc having two substrates,
- one of said substrates being disposed on the other of said substrates,
- each of said substrates having a thickness h, and
- at least one of said two substrates having a reflective layer having a signal pit at a distance of nearly h from a surface of said reflective layer, said reflective layer being constructed and arranged to reflect the laser beam;

an objective lens constructed and arranged to radiate the laser beam emitted from said laser beam source on said optical disc, thereby recording or reproducing information on said optical disc; and a focus error detecting unit constructed and arranged to detect a focus error of said objective lens based on a signal obtained by sensing part of the laser beam reflected from said reflective layer, wherein a half-width of the laser beam is determined such that a coherent distance, determined by the principal wavelength and the half-width of the laser beam from said laser beam source, is shorter than an optical-path difference between a light reflected directly on the surface of said at least one of said substrates and a light which is again emitted from said at least one of said substrates after passing through said substrate and reflected on said signal pit.

12. The optical disc apparatus according to claim 11, wherein each of said substrates has a thickness of 0.6 mm and a diameter of 120 mm.

13. The optical disc apparatus according to claim 11, wherein said laser beam source comprises a semiconductor laser diode.

14. The optical disc apparatus according to claim 11 or claim 13, wherein the principal wavelength $\lambda$ of the laser beam ranges from 635 nm to 650 nm and the half-width $\Delta\lambda$ of the laser beam is 0.3 nm or more.

15. The optical disc apparatus according to claim 11 or claim 13, wherein the principal wavelength $\lambda_0$ of the laser beam ranges from 410 nm to 420 nm and the half-width $\Delta\lambda$ of the laser beam is 0.105 nm or more.

16. An optical disc apparatus comprising:
a laser beam source constructed and arranged to emit a laser beam;
an optical disc having two substrates, and
- one of said substrates being disposed on the other of said substrates,
- each of said substrates having a thickness h, and
- at least one of said two substrates having a reflective layer having a signal pit at a distance of nearly h from a surface of said reflective layer, said reflective layer being constructed and arranged to reflect the laser beam;

an objective lens constructed and arranged to radiate the laser beam emitted from said laser beam source on said optical disc, thereby recording or reproducing information on said optical disc; and a focus error detecting unit constructed and arranged to detect a focus error of said objective lens based on a signal obtained by sensing part of the laser beam reflected from said reflective layer, wherein a coherent distance, determined by the principal wavelength and the half-width of the laser beam emitted from said laser beam source, is shorter than an optical-path difference between a light reflected directly on the surface of said at least one of said substrates and a light which is again emitted from said at least one of said substrates and reflected on said signal pit, and the half-width is set so that a radius of the laser beam, determined by a numerical aperture of said objective lens, a focal length of said objective lens, the principal wavelength of the laser beam, and the half-width of the laser beam becomes smaller than a track width between adjacent signal pits.

17. The optical disc apparatus according to claim 16, wherein each of said substrates has a thickness of 0.6 mm and a diameter of 120 mm.

18. The optical disc apparatus according to claim 16, wherein said laser beam source comprises a semiconductor laser diode.

19. The optical disc apparatus according to claim 16, wherein the principal wavelength $\lambda_0$ of the laser beam ranges from 635 nm to 650 nm and the half-width $\Delta\lambda$ of the laser beam is 0.3 nm or more.

20. The optical disc apparatus according to any one of claims 16 or 18, wherein the principal wavelength $\lambda_0$ of the laser beam ranges from 410 nm to 420 nm and the the half-width $\Delta\lambda$ of the laser beam is 0.105 nm or more.

21. A focusing apparatus constructed and arranged to adjust a focal position of an objective lens onto a target surface, said focusing apparatus comprising:
an actuator constructed and arranged to move said objective lens in an optical axis direction;
an error sensing unit constructed and arranged to optically sense a focus error in said objective lens, said error sensing unit having a light source; and
an actuator controller constructed and arranged to control said actuator based on a signal obtained by said error sensing unit,
said light source emitting a light beam having a principal wavelength $\lambda_0$ and a half-width $\Delta\lambda$ which substantially satisfy a relation of $\lambda_0^2/\Delta\lambda \leq 2d$, where d is a working distance of said objective lens.

22. A focusing apparatus constructed and arranged to adjust a focal position of an objective lens onto a target surface covered with an optical medium, said focusing apparatus comprising:
an actuator constructed and arranged to move said target surface in an optical axis direction;
an error sensing unit constructed and arranged to a optically sense a focus error in said objective lens, said error sensing unit having a light source; and
an actuator controller constructed and arranged to control said actuator based on a signal obtained by said error sensing unit,
said light source emitting a light beam having a principal wavelength $\lambda_0$ and a half-width $\Delta\lambda$ which substantially satisfy a relation of $\lambda_0^2/\Delta\lambda \leq 2 \cdot t(n_2^2 - \sin^2\theta)^{0.5}$, where t is a thickness of said optical medium covering said target surface, $n_2$ is a refractive index of the optical medium, and $\theta$ is a light incidence angle of the optical medium.

23. A focusing apparatus for focusing an objective lens onto a target surface of a material, said focusing apparatus comprising:
an actuator constructed and arranged to move said objective lens relative to the target surface;
an error sensing unit constructed and arranged to optically detect a focus error of said objective lens, said error sensing unit including a light source; and
an actuator controller constructed and arranged to control said actuator a signal obtained by said error sensing unit, wherein a light beam emitted from said light source of said error sensing unit has a half-width $\Delta\lambda$ that satisfies the following relation:

$$\lambda_0^2/\{2t(n_2^2-NA^2)^{0.5}\} \leq \Delta\lambda$$

where $\lambda_0$ is a principal wavelength of the light beam, NA is a numerical aperture of said objective lens, t is a thickness of the material, and $n_2$ is a refractive index of the material.

24. The focusing apparatus according to claim 21, wherein said light source comprises a semiconductor laser diode.

25. The focusing apparatus according to claim 23, wherein said light source comprises a semiconductor laser diode.

26. A focusing apparatus for focusing an objective lens onto a target surface of a material, said focusing apparatus comprising:

an actuator constructed and arranged to move said objective lens relative to the target surface;

an error sensing unit constructed and arranged to optically detect a focus error of said objective lens, said error sensing unit including a light source; and an actuator controller constructed and arranged to control said actuator based on a signal obtained by said error sensing unit, wherein a half-width of a light beam emitted from said light source is determined so that a coherent distance, determined by a principal wavelength and the half-width of the light beam, becomes shorter than an optical-path difference between a light beam reflected directly on the target surface and a light beam which is again emitted from the target surface after passing through the material.

27. The focusing apparatus according to claim 26, wherein said light source comprises a semiconductor laser diode.

* * * * *